(12) United States Patent
Watkinson

(10) Patent No.: US 8,796,556 B2
(45) Date of Patent: Aug. 5, 2014

(54) FLAKES MADE OF MATERIALS SUCH AS GLASS

(76) Inventor: Charles Watkinson, Yorkshire (GB)

( * ) Notice: Subject to any disclaimer, the term of this patent is extended or adjusted under 35 U.S.C. 154(b) by 591 days.

(21) Appl. No.: 12/679,890

(22) PCT Filed: Sep. 24, 2008

(86) PCT No.: PCT/GB2008/003230
§ 371 (c)(1),
(2), (4) Date: Jun. 30, 2010

(87) PCT Pub. No.: WO2009/040520
PCT Pub. Date: Apr. 2, 2009

(65) Prior Publication Data
US 2010/0288538 A1    Nov. 18, 2010

(51) Int. Cl.
*H01K 3/22*    (2006.01)
*H05K 1/00*    (2006.01)
*H05K 1/03*    (2006.01)
*H05K 3/00*    (2006.01)

(52) U.S. Cl.
CPC ............ *H05K 1/0306* (2013.01); *H05K 3/0011* (2013.01)
USPC ............................................. 174/258; 29/848

(58) Field of Classification Search
CPC ........................... H05K 3/0011; H05K 1/0011
USPC ............................................. 174/258; 29/848
See application file for complete search history.

(56) References Cited

U.S. PATENT DOCUMENTS

| | | | |
|---|---|---|---|
| 4,217,082 A | 8/1980 | Bourdeau | 25/8 |
| 5,294,237 A | 3/1994 | Mizuno | 65/21.1 |
| 2004/0146642 A1 | 7/2004 | Josephy | 427/248.1 |
| 2007/0101822 A1 | 5/2007 | Hattori | 75/255 |

FOREIGN PATENT DOCUMENTS

| | | |
|---|---|---|
| CH | 215364 A | 6/1941 |
| GB | 754180 | 8/1956 |
| WO | WO 00/051896 A1 | 9/2000 |
| WO | WO 2004/056716 A | 7/2004 |

*Primary Examiner* — Jeremy C Norris
(74) *Attorney, Agent, or Firm* — Morgan, Lewis & Bockius LLP

(57) ABSTRACT

The present invention provides flake having a thickness up to 350 nm, the flake being made of basalt, ceramics, alumina, graphite, a metal, a metal oxide or a combination of any two or more thereof. Equipment for manufacturing such flake is also described as is a method for the manufacture of the flake. The equipment comprises a cup mounted for rotation and for receiving molten glass. The equipment further comprises either insulating means extending at least partially around said cup or means for heating the cup while it is rotating.

28 Claims, 3 Drawing Sheets

FLAKES MADE OF MATERIALS SUCH AS GLASS

CROSS-REFERENCE TO RELATED APPLICATIONS

This application is a U.S. National Phase of PCT Patent Application No. PCT/GB2008/003230 filed Sep. 24, 2008 and claims priority to United Kingdom Patent Application No. GB 0718472.4filed Sept. 24, 2007 the disclosures of which are incorporated herein by reference in their entirety for all purposes.

FIELD OF THE INVENTION

This invention relates to flakes or other particles of glass or other vitreous, ceramic or metallic materials, in particular to flakes or particles having a small thickness, to methods of manufacturing such flakes or particles, certain uses of them and to items containing them.

BACKGROUND TO THE INVENTION

A method of producing glass flakes is known which makes use of a spinning cup to produce a flat film of molten glass emanating radially from the rim of a rotating cup. The film is fed between two plates, forming an annular venturi and is super-cooled with forced air. The film is broken up due to the high velocity air stream and the drag (frictional resistance) imparted by it. Such a method and apparatus to perform it is the subject of EP 0 289 240.

The parameters involved in the successful production of a flat glass flake of even thickness, according to the method described in EP 0 289 240 are varied and complex. They have been found to include the following:—
  glass composition, melt temperature and viscosity
  temperature of glass in the melt tank
  mass flow of glass leaving the tank and entering the cup
  temperature of the glass entering the cup
  distance between the outlet of the glass tank and entry to the cup
  diameter and depth of the cup
  heat dissipation properties of the cup
  rotational speed of the cup
  distance between the rim of the cup and entry to the radial venturi
  distance between the plates forming the radial venturi
  diameter of the venturi plates
  volume and pressure of air being drawn between the venturi plates
  temperature of the air flowing between the venturi plates
  diameter and construction of the cyclone collector These parameters can all be varied with the result that glass flakes either are or are not produced. Flakes, if produced, may be flat or wavy. The flakes may have a substantial variation in thickness or be very consistent in thickness. The flakes may be large or small in cross-section and/or thickness.

Using the said method and with appropriate control of the above mentioned parameters, it was initially possible to prepare flake having a mean thickness range of from 1 to 10 µm. Further development work resulted in the ability to produce flake having a mean thickness of from 350 nm to 1 µm.

However such a method could not be used for the manufacture of silica (glass) flake having a mean thickness below about 350 nm.

With a view to producing flakes below about 350 nm, the apparatus disclosed in WO 2004/056716 provides for the heating of the descending glass stream from the melter tank by passing an electrical current through the said stream between an upper electrode near the exit spout from the melter tank to a lower electrical connection attached to the spinning device. However there are a number of disadvantages associated with such apparatus. Firstly, such equipment typically requires a very high voltage (typically in excess of 5,000 V and in many cases up to 10,000 V) to ensure sufficient heating and this creates a very serious risk of electrocution for the operator. Secondly, such equipment often fails to function efficiently for prolonged production runs. Without wishing to be bound by any theory, it is thought that this is because the hot glass stream entering the cup solidifies on contact with the much cooler mass of the spinning cup and forms an electrically insulating layer, which greatly reduces the amount of current that passes up the descending glass stream and thus the associated heating.

WO 2004/056716 also provides for the heating of the descending glass stream by the use of RF induction heating but that method has been found to be inefficient and difficult to implement effectively in production.

STATEMENTS OF THE INVENTION

Figure 1:
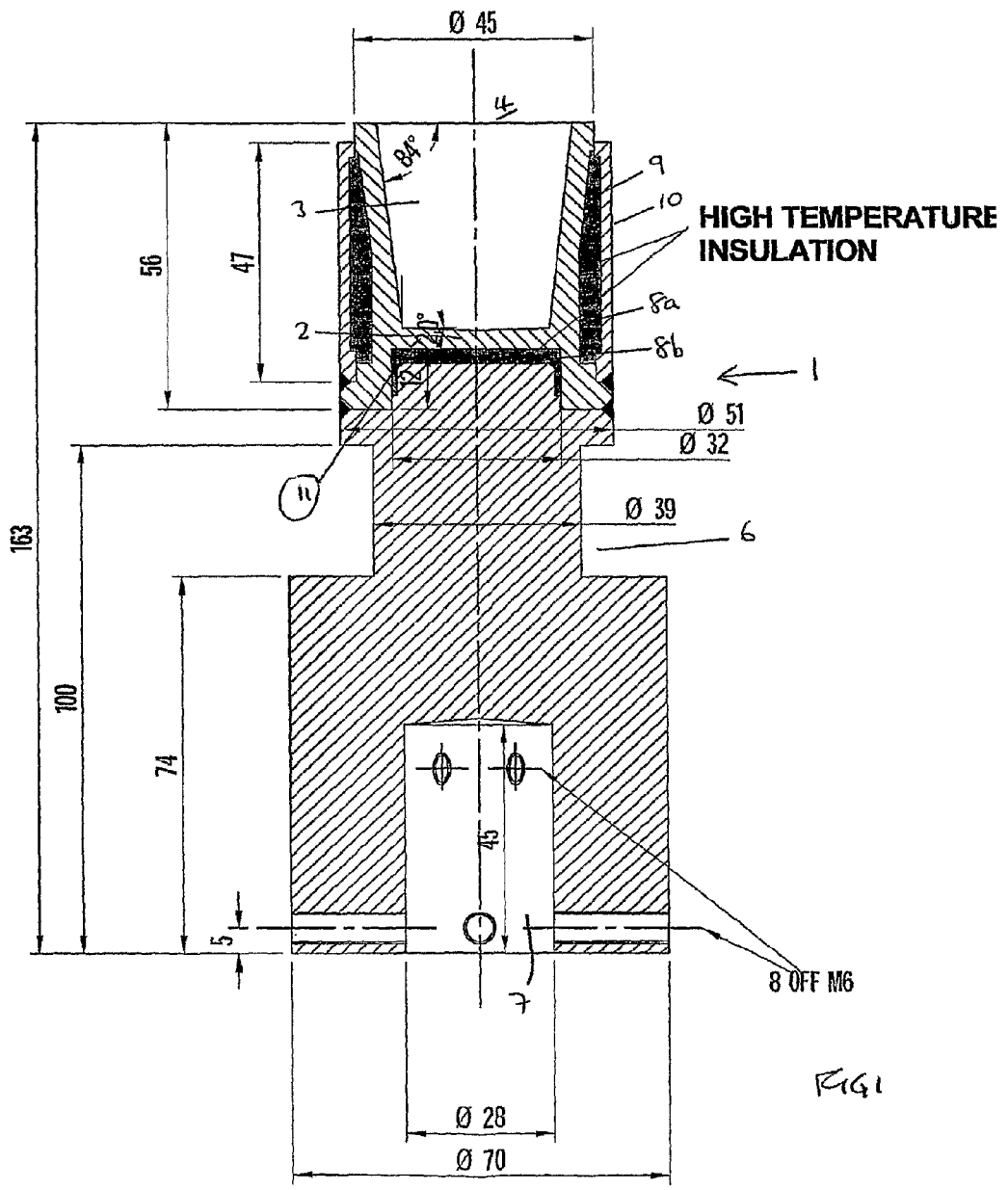
FIG. 1 illustrates an embodiment of a cup of the invention.

The Flakes
  According to the present invention there is provided flake having a mean thickness up to 350 nm. Preferably, the flake has a mean thickness of up to 200 nm. A particularly preferred range is from 10 to 100 nm including a range of from 40 to 100 nm.

Preferably, the aspect ratio of the maximum transverse dimension to thickness is from 50:1 to 25,000:1, preferably from 50:1 to 1500:1.

Flakes in accordance with the present invention may be composed of glass, basalt, ceramics such as alumina, graphite and metals, for instance copper. Glass is the preferred material, an example being ECR glass. Other examples are C glass, E glass LA glass.

It is preferred that glass flake of the present invention is of a substantially uniform thickness. Preferably, at least 80% of the glass flake is within 20% of the nominal mean thickness.

Method of Making the Flakes
  In order to manufacture glass flakes according to the invention, with a low thickness and/or low thickness distribution, it has been discovered that it is necessary to carefully control the following parameters:—
  glass composition, melt temperature and viscosity
  temperature of glass in the melt tank
  mass flow of glass leaving the tank and entering the cup
  temperature of the glass entering the cup
  distance between the outlet of the glass tank and entry to the cup
  diameter and depth of the cup
  heat dissipation properties of the cup
  rotational speed of the cup
  distance between the rim of the cup and entry to the radial venturi
  distance between the plates forming the radial venturi
  diameter of the venturi plates volume and pressure of air being drawn between the venturi plates temperature of the air flowing between the venturi plates diameter and construction of the cyclone collector To make glass flakes according to the invention it has further been found that it is necessary to operate the melter tank at higher temperatures in the range of 1050 to 1600° C.

It has further been found that to produce such flakes it is particularly important to control very carefully (i) the temperature of the glass stream leaving the melt tank (ii) the mass flow of the glass stream, (iii) the heat loss of the glass in the spinning cup and (iv) the spinning of the molten film and its stretching (before it is super-cooled and broken into flake).

In relation to the control of the temperature of the glass stream leaving the melter tank within the desired range, it is important to reduce the amount of heat loss to a very low level.

It has been found that the molten glass loses a lot of heat in the spinning cup, which is made of metal and has a high mass, conductivity and specific heat properties relative to the amount of molten glass in it at any single point in time during the production process. The amount of heat loss in known cups, whilst desirable for the production of thicker flake, has surprisingly been found to be a limiting factor in the thinness of flakes that can be made with known equipment. To reduce the thickness of the resulting flake to make flakes according to the invention it has been found that it is desirable to insulate the cup to prevent heat loss. Further it has been found that it is desirable to provide a means for heating the cup.

By the use of such insulation and/or heating it is possible to dispense with the use of external RF (microwave) heating of the descending glass stream (of the type as described in WO 2004/056716) or else it can be achieved with an increased fall of the glass, thus facilitating increased ease of operation of the equipment by the user.

In a preferred embodiment of the invention, both external RF heating and insulation and/or heating of the cup are used. The interaction between such elements enables the glass to leave the cup and enter the venturi plates at a much higher temperature than with known methods and permits the production of small flakes with a mean thickness in the range of 10 to 350 nm. Without wishing to be bound by any particular theory, it is believed that the external heating of the glass, during its descent from the melter, ensures that the insulated and/or heated cup stays at a much higher temperature thus enabling the exiting glass to be made into thinner flakes on passing through the venturi plates.

The Cup

The insulation of the cup will now be described in more detail with reference to FIG. 1 of the accompanying drawings which is a longitudinal section through part of equipment of the present invention.

The cup 1 is manufactured from e.g. a suitable steel but other metals such as platinum could be used as could other alloys. Forming the upper part of the cup there is an upper portion 2. The upper portion has a central conical section 3 removed. The diameter of the removed section 4 is 48 mm at the top and 28 mm at the bottom and the internal depth of the cup 1 is from 15 to 16 mm.

The upper portion 2 is detachable from and fixably connected to a lower portion 6. The lower portion 6 has a lower removed cylindrical section 7 for detachably connecting the lower portion 6 to the output drive shaft of an electric motor (not shown).

To produce flakes according to the invention it is necessary to provide very effective insulation around the central conical section 3. Insulation which is sufficient to enable this to be achieved is shown on FIGS. 1 (8a and 8b). The upper portion 3 has had a cylindrical recess 9 machined into it. Materials suitable for use as insulation include a high temperature ceramic fibre blanket. So as to hold the insulation 8a in place a close fitting outer substantially cylindrical section 1 is provided, which is capable of being detachably or permanently connected to the upper portion 2 by known connection means such as bolts (not shown) or by welding.

To consistently make flakes according to the invention it has been found that advantageously further insulation 8b can be used at the lower end of the central conical section 3. This is fitted into a machined recess 11 and held in place when the lower portion 6 is connected to the upper portion 2 by known connection means such as bolts (not shown) or by welding.

The Heating Device

The heating device for the cup will now be described in more detail by reference to FIGS. 2 and 3 of the accompanying drawings.

Figure 2:
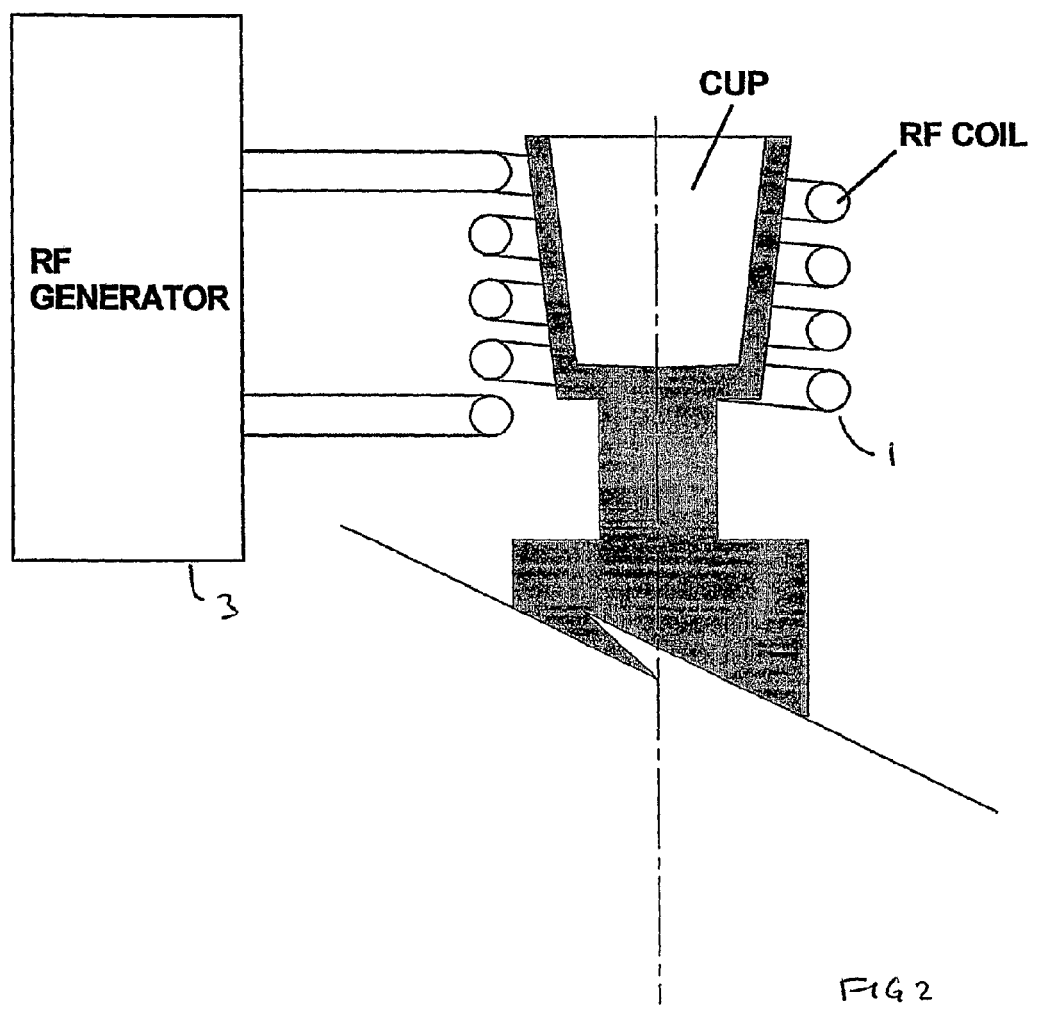
FIG. 2 illustrates an embodiment of a heating device of the invention.

FIG. 2 shows a suitable heating device which comprises a coil 1 fitted closely around the spinning cup 2 connected to an RF (microwave) generator 3 which in operation induces energy directly into the metal cup 2.

Figure 3:
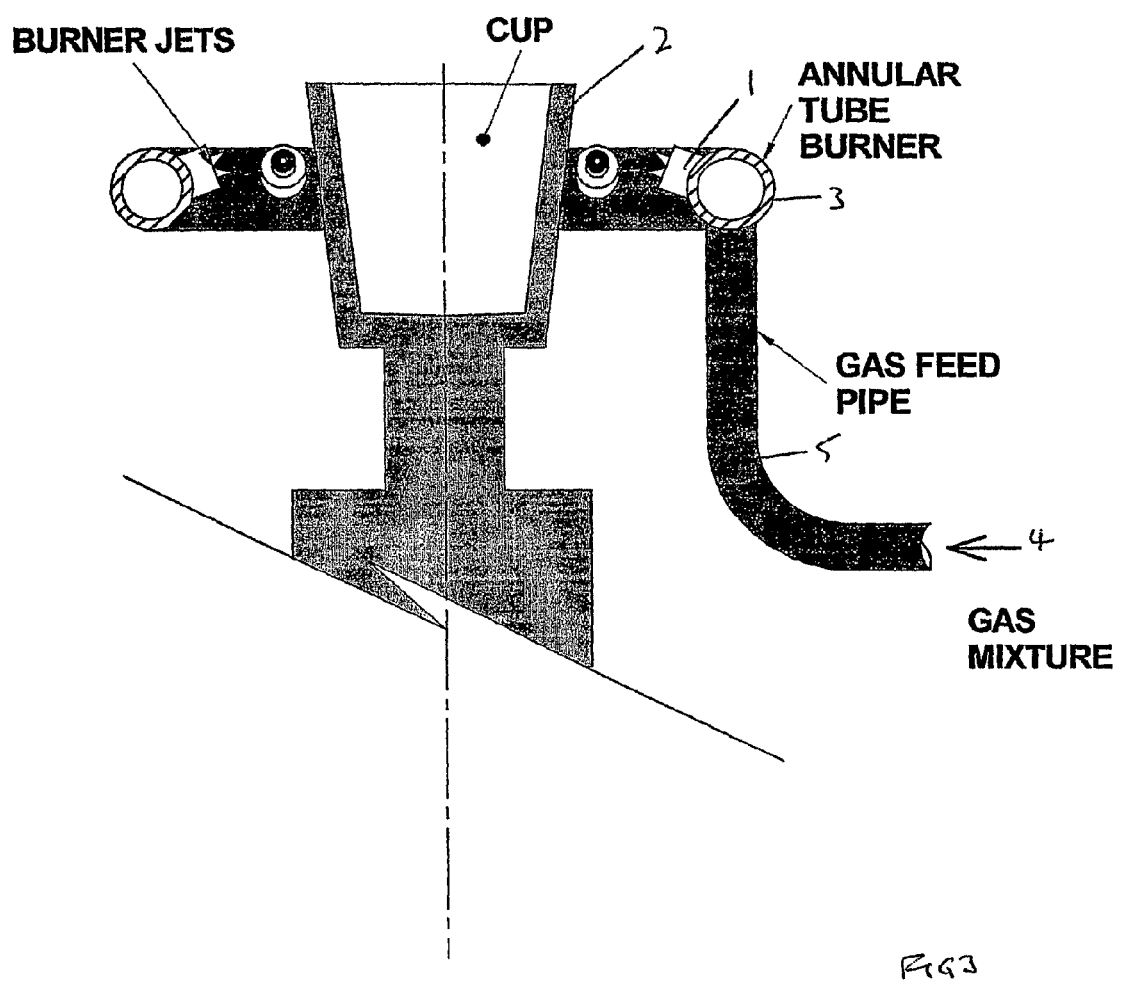
FIG. 3 illustrates an embodiment of a heating device of the invention.

FIG. 3 shows an alternative array of gas flame jets 1 directed inwardly from annular tube burner 3 (fed with gas mixture 4 along gas feed pipe 5) onto the outer surface of the cup 2 to heat it or simply reduce heat loss from the spinning cup.

The preferred method is the RF heating method described above and illustrated in FIG. 2 as by using it there is no risk of the gas jets inadvertently pre-heating the cooling air stream which flows into and between the venturi plates. Such preheating may make it impossible or difficult to produce (consistently) the desired flakes.

EXAMPLES

Examples of the method using the apparatus according to the invention will now be given.

Example 1

| | |
|---|---|
| Glass type | ECR Glass |
| Glass temp at exit from tank | 1230° C. |
| Height of drop | 400 mm |
| Venturi Plate Gap | 10 mm |
| Air Pressure | 380 mm WG |
| Cup Diameter | 48 mm |
| Cup Type | Insulated |
| Cup Speed | 5000 RPM |
| Flakes mean thickness produced | 350 nm |

In relation to the control of the mass flow of the glass stream leaving the melter tank, this can also be increased or reduced and hence controlled by preferably using a nozzle which is oversized relative to the size of the desired flow. The said nozzle is cooled, thereby solidifying glass at the outer diameter of the nozzle bore and constricting the glass stream prior to it being fed in a downward direction using appropriate cooling apparatus (for example that cooling apparatus described in patent application WO 2004/056716). Alternatively, a sliding gate vale apparatus can be attached to the front of the nozzle to control flow.

Example 2

| | |
|---|---|
| Glass type | LAG6 Borosilicate. |
| Glass temp at exit from tank | 1360° C. |
| Height of drop | 350 mm |
| Venturi Plate Gap | 8 mm |
| Air Pressure | 420 mm WG |
| Cup Diameter | 38 mm |
| Cup Type | Insulated |
| Cup Speed | 6000 RPM |
| Flakes mean thickness produced | 100 nm |

There are closer tolerances on the cup size and annular venturi and a higher velocity through the venturi and a lower air pressure.

For any particular glass composition, there are a set of parameters which will produce a flat flake of consistent thickness. The following ranges and conditions may be adopted, or at least some of them, in order to produce very thin glass flake according to the invention:
mass flow between 0.2 and 2.5 kilos per minute
glass temperature at control nozzle of from 1200 to 1450° C.
glass temperature of the spinning cup of from 1220 to 1350° C.
distance between the melt tank control nozzle and entry to the spinning cup of from 75 to 500 mm
spinning cup diameter of from 28 to 48 mm OD
spinning cup depth of from 15 to 60 mm
Rotation speed of the spinning cup from 5000 to 14,000 RPM
spinning cup externally insulated as per example 2 and/or heated.
distance between edge of spinner and entry to annular venturi of from 10 to 75 mm
gap between plates forming annular venturi of from 2 to 12 mm
air pressure within system of from 180 to 580 mm water gauge The above are parameters that, for a given mass flow and temperature, it is possible to produce nano particulate flake within the thicknesses mentioned above. The glass composition may vary widely and it is also possible to produce ceramic flake within these parameters but using a temperature of between 1450 and 1800° C. and a cooled spinning cup. The parameters may be required to be varied when producing flake from metals or other heat liquidous (meltable) materials.

Uses of the Flakes

Glass flake of the present invention may be a component of numerous other materials, for instance, fillers. The other materials may be selected from a wide range of known materials. An example is a polyolefin plastics material. Examples of such material are polyethylene, polypropylene, PTFE, polyvinyl difluoride and polybutanes. Other materials include polyesters, epoxy resins and polysiloxanes.

Incorporating glass flake of the present invention into other materials has surprisingly been found to produce improvements in mechanical properties, for instance impact resistance, wear resistance, tensile strength, flexibility, compression strength and creep deformation.

Materials incorporating glass flakes according to the invention herein disclosed may provide barrier films and laminates and avoid the need for a separate barrier coating.

Further they may be incorporated in elastomers, for instance silicone rubbers and natural rubbers, examples being in conveyor belts and tyres.

The glass flakes described herein may be incorporated into packaging materials thicker than films (such as are used in the manufacture of bottles) to stop gas diffusion or used in place of naturally occurring clay nano-flake to better effect at a lower cost.

The glass flakes described herein may be added to the compounds and formulations used in the manufacture of linoleum floor coverings or tiles to improve wear characteristics and appearance.

The glass flakes described herein may also be used in the compounds and formulations used in the manufacture of electric cable insulation to give better fire retardancy and/or reduce smoke emissions.

The glass flakes described herein may further be added to the compounds and formulations used in the manufacture of the backing materials of floor coverings and carpets, for example those used in aircraft, again to give better fire retardancy and reduce smoke emissions.

The glass flakes described herein may be used in the manufacture of coatings, for example PTFE, for use in the coating of frying pans or other cookware where temperature and scratch resistance are both improved.

The glass flakes described herein may be used in or with compounds or formulations used in the production of brake blocks and shoes whereby the frictional grip is improved and wear reduced.

The glass flakes described herein may further be used in the manufacture of paper to improve tear strength and resistance to water damage.

The glass flakes described herein may yet further be used in or with compounds or formulations used in the production of printed circuit boards and flexible electronic printed circuitry to improve one or more of strength, thermal stability and electrical resistance. Alternatively, a product of the normal strength, thermal stability and/or resistance can be made but making use of thinner material leading to cost reduction.

In the uses described herein the glass flake may be coated with an agent having a first chemical group that is reactive with the glass flake and a second chemical group that is reactive with the compound or formulation to which the coated glass flake is added.

In the uses described herein, it may be necessary or desirable to use bonding, coupling or other stabilising agents or additives, known to those skilled in the relevant art, to facilitate the effective uses of the said flakes.

The invention claimed is:

1. Glass flake having a mean thickness of 40 to 200 nm, wherein at least 80% of the flake is within 20% of the nominal mean thickness.

2. Flake according to claim 1, wherein the thickness is from 10 to 100 nm.

3. Flake according to claim 2, wherein the thickness is from 40 to 100 nm.

4. Flake according to claim 1, wherein the aspect ratio of the maximum transverse dimension to thickness is from 50:1 to 25,000:1.

5. Flake according to claim 4, wherein the aspect ratio is from 50:1 to 1500:1.

6. Flake according to claim 1, wherein the glass is ECR glass, C glass or E glass.

7. Flake according to claim 1, wherein the flake comprises two or more metals or two or more metal oxides.

8. A material containing flake according to claim 1 as a component thereof, said material having an improved property selected from impact resistance, tensile strength, flexibility, compression strength and creep deformation.

9. A barrier film or laminate comprising flake according to claim 1.

10. An elastomer comprising flake of claim 1.

11. A member selected from thick packaging films and bottles comprising flake of claim 1, said member having reduced gas diffusion.

12. A linoleum floor covering comprising flake according to claim 1, said floor covering having and improved property selected from improved wear characteristic, appearance and a combination thereof.

13. A member selected from a floor covering and a carpet comprising flake according to claim 1, said member having an improved characteristic selected from better fire retardancy, reduced smoke emissions and a combination thereof.

14. A coating comprising a flake according to claim 1, said coating having an improved member selected from the temperature performance and scratch resistance of said coating.

15. A member selected from brake blocks and brake shoes containing flake according to claim 1, said member having an improved property selected from frictional grip and reduced wear.

16. A member selected from a paper and a cardboard product comprising flake as claimed in claim 1.

17. A member selected from a printed circuit board and an item of flexible electronic printed circuitry comprising flake according to claim 1.

18. Equipment for making flakes, the equipment comprising a cup mounted for rotation about a longitudinal axis, means for feeding molten glass into said cup, and means for rotating said cup about said axis whereby a film of molten glass is caused to emanate radially from the rim of said cup, the equipment including a member selected from insulating means extending at least partially around said cup and means for heating the cup while it is rotating, and wherein the equipment is provided with plates forming an annular venturi and for receiving the film of molten glass, with the distance between the edge of the cup and the entry into the annular venturi plates being from 10 to 75 mm.

19. Equipment according to claim 18, wherein the equipment includes insulating means extending at least partially around said cup.

20. Equipment according to claim 18, wherein the equipment includes means for heating the molten glass as it is being fed to said cup.

21. Equipment according to claim 18, wherein the equipment includes a vessel for holding molten glass, said vessel being provided with a nozzle for controlling flow therefrom, wherein the distance between the control nozzle and the entry to the spinning cup is between 75 to 850 mm.

22. Equipment according to claim 18, wherein the diameter of the spinning cup is from 28 to 48 nun OD.

23. Equipment according claim 18, wherein the depth of the spinning cup is from 15 to 60 mm.

24. Equipment according to claim 18, wherein the depth between the plates forming the annular venturi is from 2 to 12 mm.

25. Equipment according to claim 18, wherein the equipment includes means for applying an air pressure of from 180 to 580 mm water gauge.

26. Equipment according to claim 18, wherein the equipment includes means for providing a mass flow of the glass from a source thereof to the cup of between 0.4 and 2.5 kilograms of glass per minute, the glass temperature at the exit from said source being from 1200 to 1400° C. and the glass temperature at the spinning cup being from 1180 to 1380° C.

27. A method of manufacturing glass flakes including feeding molten glass into the cup of equipment of claim 18, and rotating said cup about its longitudinal axis to cause molten glass to emanate radially from the rim of said cup.

28. The method according to claim 27 wherein the following parameters are used: the mass flow of the glass from the vessel is between 0.5 and 2.5 kilograms of glass per minute, the glass temperature at the control nozzle is from 1200 to 1400° C., and the glass temperature at the spinning cup is from 1080 to 1380° C.

* * * * *